United States Patent
Cho et al.

(10) Patent No.: US 7,639,558 B2
(45) Date of Patent: Dec. 29, 2009

(54) PHASE CHANGE RANDOM ACCESS MEMORY (PRAM) DEVICE

(75) Inventors: Beak-hyung Cho, Hwaseong-si (KR);
Kwang-jin Lee, Hwaseong-si (KR);
Mu-hui Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 713 days.

(21) Appl. No.: 11/315,347

(22) Filed: Dec. 23, 2005

(65) Prior Publication Data
US 2006/0291277 A1 Dec. 28, 2006

(30) Foreign Application Priority Data
Jun. 22, 2005 (KR) ............... 10-2005-0053898

(51) Int. Cl.
*G11C 8/08* (2006.01)
*G11C 8/14* (2006.01)
(52) U.S. Cl. ............... 365/230.06; 365/230.03; 365/203; 365/204; 365/163; 365/148; 365/51; 365/63; 365/72
(58) Field of Classification Search ............ 365/230.03, 365/230.06, 203, 204, 51, 63, 72, 163, 148
See application file for complete search history.

(56) References Cited

U.S. PATENT DOCUMENTS

| 6,731,535 | B1 | 5/2004 | Ooishi et al. | 365/171 |
| 6,778,421 | B2 * | 8/2004 | Tran | 365/105 |
| 6,781,860 | B2 | 8/2004 | Parkinson | 365/100 |
| 7,027,342 | B2 * | 4/2006 | Inoue | 365/210 |
| 7,227,776 | B2 * | 6/2007 | Cho et al. | 365/163 |
| 2007/0133271 | A1 * | 6/2007 | Cho et al. | 365/163 |

FOREIGN PATENT DOCUMENTS

KR 100300042 B1 6/2001

* cited by examiner

*Primary Examiner*—Andrew Q. Tran
(74) *Attorney, Agent, or Firm*—Volentine & Whitt, PLLC

(57) ABSTRACT

A phase change memory device has a word line driver layout which allows for a reduction in the size a core area of the device. In one aspect, phase change memory device includes a plurality of memory cell blocks sharing a word line, and a plurality of word line drivers driving the word line. Each of the word line drivers includes a precharge device for precharging the word line and a discharge device for discharging the word line, and where the precharge device and the discharge device are alternately located between the plurality of memory cell blocks.

20 Claims, 4 Drawing Sheets ized as a ground voltage, that the PRAM cell array (not shown). Specifically, in this example, the N-junction of the diode D is connected to the word line WL and the P-junction of the diode D is connected to a bit line BL via the phase-change resistive element 11.

PHASE CHANGE RANDOM ACCESS MEMORY (PRAM) DEVICE

BACKGROUND OF THE INVENTION

1. Field of the Invention

The present invention generally relates to semiconductor memory devices, and more particularly, the present invention relates to phase change random access memory (PRAM) devices.

A claim of priority is made to Korean Patent Application No. 10-2005-0053898, filed on Jun. 22, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIGS. 1A and 1B illustrate a memory cell 10 in a 'set' state and in a 'reset' state, respectively, and FIG. 2 is an equivalent circuit diagram of the memory cell 10 of FIGS. 1A and 1B. As shown, the memory cell 10 includes a phase-change resistive element 11 and diode D connected in series between a bit line BL and a word line WL.

It should be noted that the structure of the phase-change element 11 is presented as an example only, and that other structures may be possible. Similarly, the connections illustrated in FIGS. 1A, 1B and 2 are presented as examples only, and other configurations are possible. For example, the memory cell 10 may include the phase-change resistive element 11 and a transistor connected in series between the bit line BL and reference potential, with the transistor gated to the word line WL.

In each of FIGS. 1A and 1B, the phase-change resistive element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The diode D is electrically connected between the bottom electrode 18 and the word line WL of the PRAM cell array (not shown). Specifically, in this example, the N-junction of the diode D is connected to the word line WL and the P-junction of the diode D is connected to a bit line BL via the phase-change resistive element 11.

In FIG. 1A, the phase-change material 14 is illustrated as being in its crystalline state. As mentioned previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are establish by controlling the magnitude and duration of current flow through the BEC 16. That is, as shown in FIG. 2, the memory cell 10 is activated (or accessed) by applying a LOW level voltage to the word line WL. When activated, the phase-change element is programmed according to the voltage of the bit line BL. More specifically, the bit line BL voltage is controlled to establish a programming current which causes the BEC 16 to act as a resistive heater which selectively programs the phase-change material 14 in its 'set' and 'reset' states.

FIG. 3 is a view showing the core structure of a conventional phase change memory device 300.

Referring to FIG. 3, the phase change memory device 300 includes memory cell blocks CBLK11, CBLK12, . . . , CBLKn1, and CBLKn2 each including memory cells C11 through C1n; word line driving blocks WDU11, WDU12, . . . WDUn1 and WDUn2 which drive respective word lines WL11 and WL12 . . . of the memory cell blocks CBLK11, CBLK12, . . . , CBLKn1, and CBLKn2; and bit line selection blocks YPASS11, YPASS12, . . . , YPASSn1, and YPASSn2, each of which selects bit lines BL11 through BL1n of a corresponding memory cell block CBLK11, CBLK12, CBLKn1, or CBLKn2. Also, FIG. 3 illustrates block areas which may contain a column decoder YDEC, a sense amplification circuit SA, and a write driver WD.

The operation of the phase-change memory cell 300 will be briefly described with reference to the memory cell block CBLK11. The remaining memory cell blocks CBLK12, . . . , CBLKn1, and CBLKn2 all function in a similar manner.

The word line driving block WDU11 includes a plurality of word lines driving circuits WDC11 which are responsive to first and second selection signals Si and Ai to drive the corresponding word lines WL11. The bit line selection block YPASS11 includes a plurality of bit line selection circuits BCD11 through BCD1n for selecting the corresponding bit lines BL11 through BL1n. In this example, the bit line selection circuits BCD11 through BCD1n are transistors respectively turned on/off in response to bit line selection signals Y11 through Y1n.

In order to store data in a selected memory cell C11, the bit line selection circuit BDC11 of the bit line selection block YPASS11 is activated in response to a bit line selection signal Y11. Thus, a current received from a global bit line (not shown) is applied to the selected bit line BL11.

At this time, the voltage of the word line WL11 selected by the word line driving circuit WDC11 falls to a ground voltage, and thus a current is applied to the memory cell C11 connected to the word line WL11 among memory cells connected to the selected bit line BL11.

The current changes the state of the phase change material GST of the memory cell C11 and flows to the word line driving circuit WDC11 via the diode D and the word line WL11. In this example, the word line driving circuit WDC11 functions as a logical NAND circuit which receives the first selection signal Si and the second selection signal Ai. The first selection signal Si and the second selection signal Ai may be signals obtained by decoding an address signal (not shown) for selecting a word line. If both the first and second selection signals Si and Ai are high, the corresponding word line WL11 is selected. If either or both of the first and second selection signals Si and Ai is low, the corresponding word line WL11 is not selected.

The logical NAND functionality of the word line driving circuit WDC11 is implemented by the combination of an AND device and an inverter. In the word line driving circuit WDC11 having such an inverter, a PMOS transistor and a NMOS transistor are arranged together. Accordingly, in order to prevent latch-up of the transistors, an isolation area which is larger than that defined according to a minimum design rule must be located between the PMOS transistor and the NMOS transistor. This isolation area increases the size of the word line driving circuit, and, accordingly, increases the size of the overall core area of the phase change memory device.

SUMMARY OF THE INVENTION

The present invention provides a phase change memory device having a word line driver layout which allows for a reduction in the size a core area of the device.

According to an aspect of the present invention, a phase change memory device is provided which includes a plurality of memory cell blocks sharing a word line, and a plurality of word line drivers driving the word line. Each of the word line drivers includes a precharge device for precharging the word line and a discharge device for discharging the word line, and where the precharge device and the discharge device are alternately located between the plurality of memory cell blocks.

According to another aspect of the present invention, a phase change memory device is provided which includes a plurality of word line drivers and a plurality of memory cell blocks. Each of the word line drivers includes a precharge device and a discharge device, each of the memory cell blocks is disposed between one of the precharge devices and one of the discharge devices, and the precharge devices and the discharge devices of the plurality of word line drivers are alternately disposed between the memory cell blocks.

According to yet another aspect of the present invention, a phase change memory device is provided which includes a plurality of memory cell blocks, each including a plurality of memory cells arranged in a matrix and sharing word lines connected to the plurality of memory cells, and a plurality of word line driving blocks respectively disposed between the plurality of memory cell blocks. Some of the word line driving blocks include precharge devices for precharging the word lines shared by the plurality of memory cell blocks, and others of the word line driving blocks include discharge devices for discharging the word lines shared by the plurality of memory cell blocks.

BRIEF DESCRIPTION OF THE DRAWINGS

The above and other features and advantages of the present invention will become more apparent from the detailed description that follows, with reference to the accompanying drawings, in which.

DETAILED DESCRIPTION OF PREFERRED EMBODIMENTS

Figure 1A:
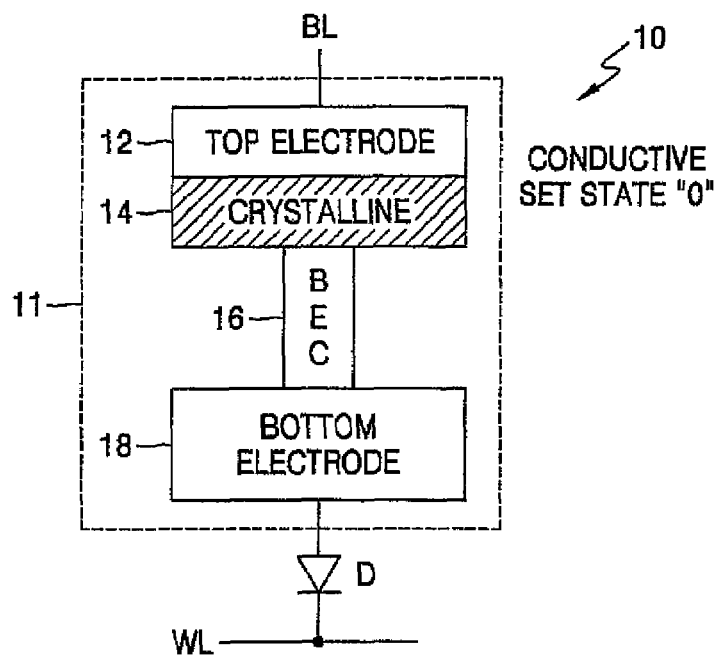
FIGS. 1A and 1B are schematic views of a phase change memory cell in a crystalline state and an amorphous state, respectively.
Figure 1B:
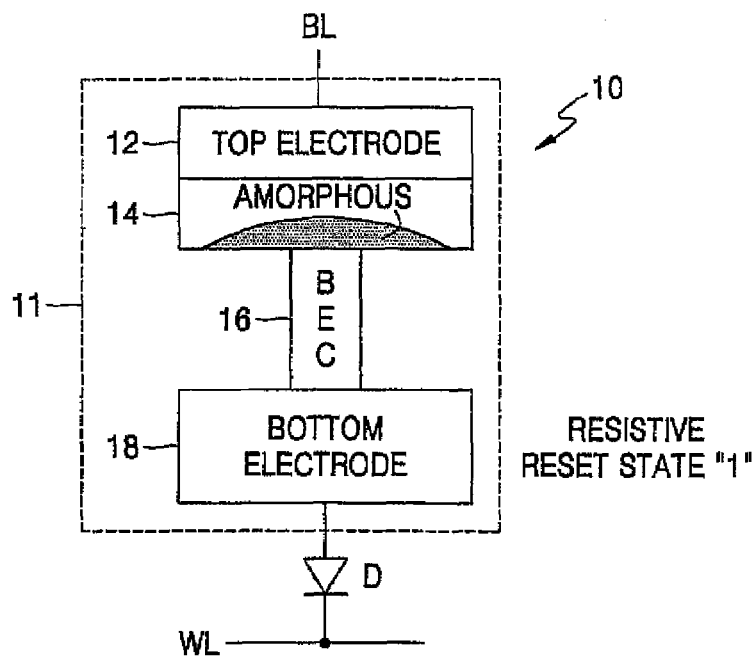
Figure 2:
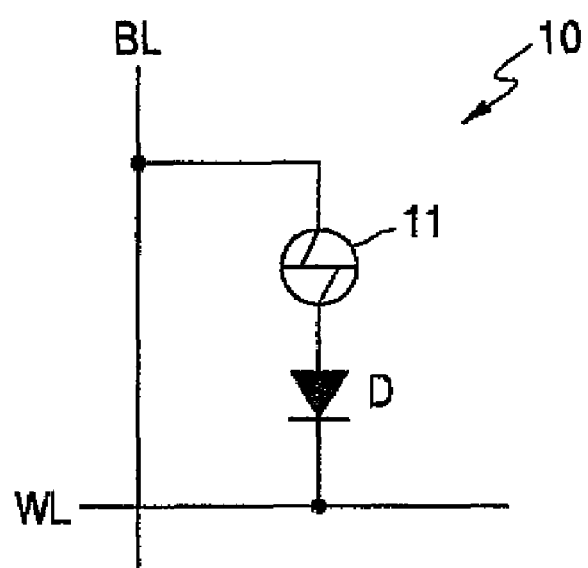
FIG. 2 is an equivalent circuit diagram of the phase change memory cell of FIGS. 1A and 1B.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 4:
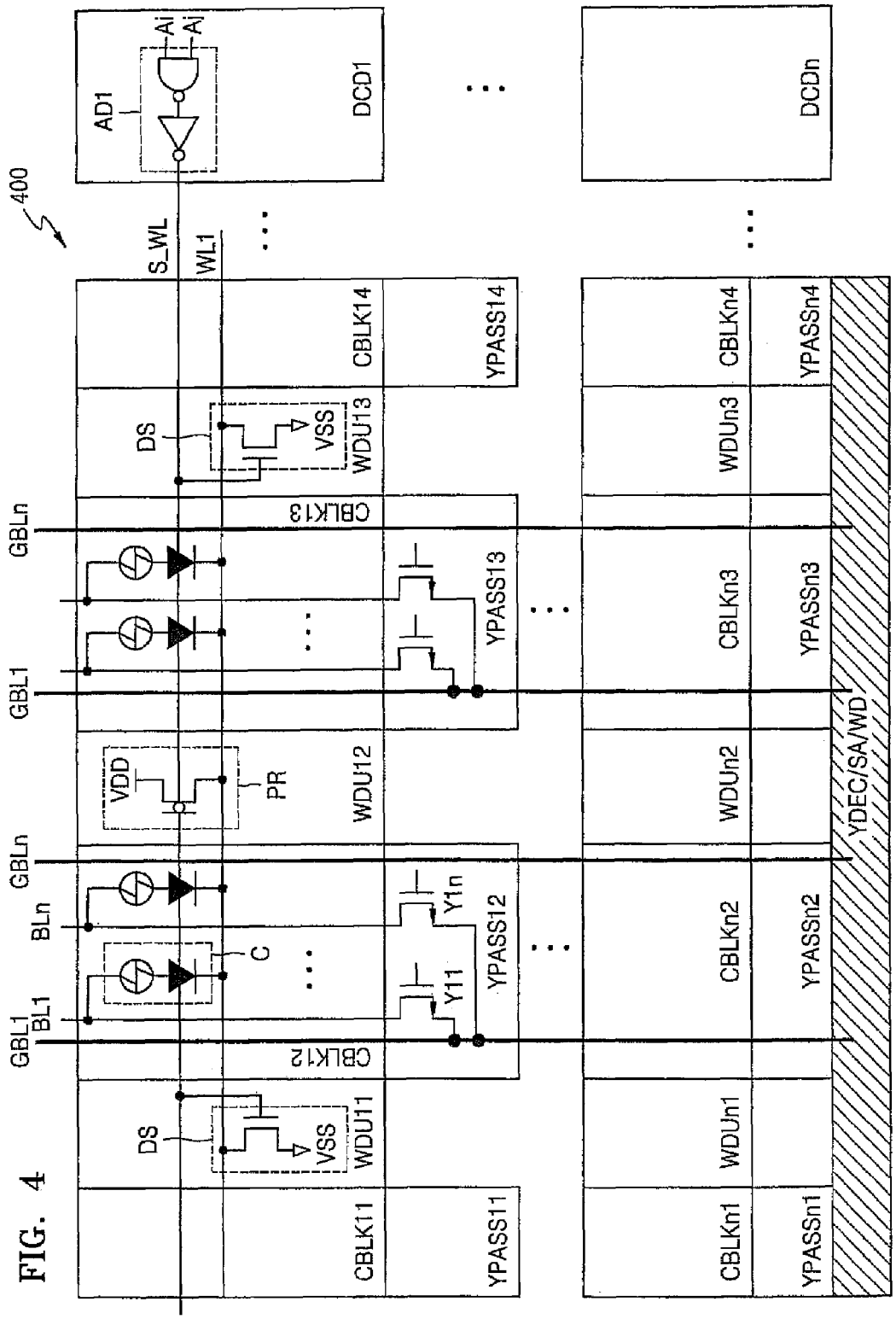
FIG. 4 is a view showing the core structure of a phase change memory device according to an embodiment of the present invention.

FIG. 4 is a view showing the core structure of a phase change memory device 400 according to an embodiment of the present invention.

Referring to FIG. 4, a plurality of memory cell blocks CBLK11, CBLK12, CBLK13, CBLK14, CBLKn1, CBLKn2, CBLKn3, and CBLKn4 are arranged in a matrix form as shown.

Also as shown, a plurality of bit line selection blocks YPASS11, YPASS12, YPASS13, YPASS14, YPASSn1, YPASSn1, YPASSn3, YPASSn4, and a plurality of word line driving blocks WDU11, WDU12, WDU13, WDUn1, WDUn2, and WDUn3, are arranged adjacent the corresponding to the memory cell blocks CBLK11, CBLK12, CBLK13, CBLKn1, CBLKn2, and CBLKn3.

Each of the memory cell blocks CBLK11, CBLK12, CBLK13, CBLK14, CBLKn1, CBLKn2, CBLKn3, and CBLKn4 of this embodiment includes a plurality of local bit lines BL1 through BLn connected to respective global bit lines GBL1 through GBLn. Connected to each of the local bit lines BL1 through BLn is a plurality of phase change memory cells C, each of which includes a phase change element and a diode connected in series between a bit line (e.g., BL1) and a word line (e.g., WL1). The phase change material of the phase change element may include germanium (Ge), antimony (Sb), and tellurium (Te).

As explained below, in the phase change memory device 400 according to the present embodiment, a word line is shared by a plurality of memory cell blocks.

In FIG. 4, the memory cell blocks CBLK11, CBLK12, CBLK13, and CBLK14 share a word line WL1 and the memory cell blocks CBLKn1, CBLKn2, CBLKn3, and CBLKn4 share another word line (not shown). The memory cell blocks CBLKn1, CBLKn2, CBLKn3, and CBLKn4 have the same structure as and operate in the same manner as the memory cell blocks CBLK11, CBLK12, CBLK13, and CBLK14.

In the phase change memory device 400 shown in FIG. 4, since the plurality of memory cell blocks CBLK11, CBLK12, CBLK13, and CBLK14 share the word line WL1, by selecting the word line WL1, all the memory cell blocks CBLK11, CBLK12, CBLK13, and CBLK14 sharing the word line WL1 can receive or output data at the same time.

That is, if the word line WL1 is selected, one or more bit lines can be selected from all or some of the memory cell blocks CBLK11, CBLK12, CBLK13, and CBLK14.

Accordingly, data writing or reading can be performed simultaneously in a plurality of the memory cells C connected between the word line WL1 and the bit lines selected by the memory cell blocks CBLK11, CBLK12, CBLK13, and CBLK14. blocks.

The word line driving blocks WDU11, WDU12, WDU13, WDUn1, WDUn21, and WDUn3 are respectively disposed between the memory cell blocks CBLK11 and CBLK12, the memory cell blocks CBLK12 and CBLK13, the memory cell blocks CBLK13 and CBLK14, the memory cell blocks CBLKn1 and CBLKn2, the memory cell blocks CBLK2 and CBLKn3, and the memory cell blocks CBLK3 and CBLKn4.

Each of the word line driving blocks WDU11, WDU12, WDU13, WDUn1, WDUn2, and WDUn3 includes ones of a precharge device PR or a discharge device DS for precharging or discharging word lines shared by the memory cell blocks CBLK11, CBLK12, CBLK13, CBLK14, CBLKn1, CBLKn2, CBLKn3, and CBLKn4. A word line driving circuit of the phase change memory device 400 includes a precharge device PR and a discharge device DS. The precharge devices PR and the discharge devices DS are alternately disposed between the memory cell blocks CBLK11, CBLK12, CBLK13, and CBLK14 to drive the word line WL1.

The precharge device PR and the discharge device DS may be MOS transistors. For example, the precharge device PR may be a PMOS transistor having a first terminal connected to a supply voltage VDD, a second terminal connected to the word line WL1, and a gate to which a selection signal S_WL is applied.

The discharge device DS may, for example, be a NMOS transistor having a first terminal connected to the word line WL1, a second terminal connected to a ground voltage VSS, and a gate to which the selection signal S_WL is applied.

Figure 3:
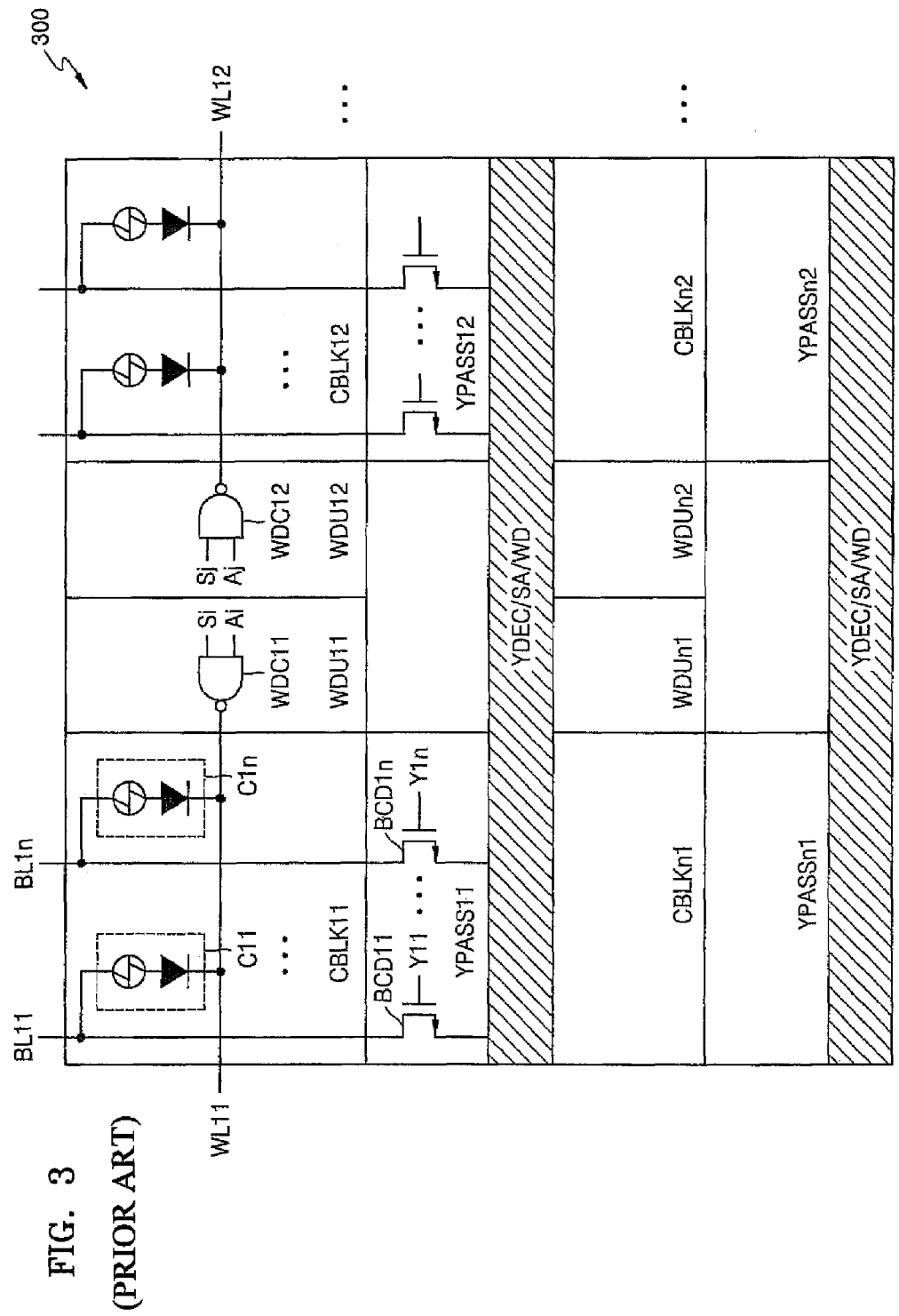
FIG. 3 is a view showing the core structure of a conventional phase change memory device.

As opposed to the conventional phase change memory device 300 shown in FIG. 3, the phase change memory device 400 according to the present embodiment shown in FIG. 4 includes a memory cell block disposed between a precharge device PR and a discharge device DS, where the precharge device PR and the discharge device DS together constitute a word line driving circuit. Therefore, it is possible to reduce the area used by isolation areas between PMOS transistors and NMOS transistors of the conventional word line driving circuit.

A plurality of precharge devices PR connected to the word line WL1 operate at the same time in response to the selection signal S_WL. Likewise, a plurality of discharge devices DS connected to the word line WL1 operate at the same time in response to the selection signal S_WL. Referring to FIG. 4, decoding blocks DCD1 through DCDn generate the selection signals S_WL. Each of the decoding blocks DCD1 through DCDn includes a plurality of decoding devices for generating the selection signals S_WL for selecting corresponding word lines WL. A decoding device AD1 in the decoding block DCD1 generates the selection signal S_WL in response to decoded signals Ai and Aj of an address signal (not shown) for selecting memory blocks and word lines. In FIG. 4, the decoding device AD1 includes a NAND device and an inverter. However, the invention is not limited to this particular configuration of the decoding device AD1.

If the selection signal S_WL is high, the discharge devices DS are turned on and the precharge devices PR are turned off. Accordingly, the word line WL1 is grounded. If the selection signal S_WL is low, the discharge devices DS are turned off and the precharge devices PR are turned on. Accordingly, the word line WL1 is supplied with a voltage VDD.

The plurality of memory cell blocks CBLK11, CBLK12, CBLK13, and CBLK14 sharing the word line WL1 share a transmission line (not shown) through which the selection signal S_WL is transmitted. The transmission line and the word line WL1 are preferably located on different layers of the phase change memory device.

In the present embodiment, the phase change cells of the phase change memory device include a phase change material of germanium (Ge), antimony (Sb), and tellurium (Te). However, the invention is not limited to such a phase change material, and other phase change materials can utilized.

As described above, in a semiconductor memory device according to an embodiment of the present invention, by separating a precharge device and a discharge device constituting a word line driving circuit, it is possible to reduce the layout size of the semiconductor memory device, the number of cells capable of being simultaneously selected in each memory cell block, and the current consumption for each memory cell block.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device comprising:
   a plurality of memory cell blocks sharing a word line; and
   a plurality of word line drivers driving the word line,
   wherein each of the word line drivers comprises a precharge device for precharging the word line and a discharge device for discharging the word line, and wherein the precharge device and the discharge device are alternately located between the plurality of memory cell blocks.

2. The phase change memory device of claim 1, wherein each of the plurality of memory cell blocks comprises:
   a plurality of global bit lines; and
   a plurality of local bit lines respectively connected to the plurality of global bit lines.

3. The phase change memory device of claim 1, wherein the plurality of memory cell blocks sharing the word line execute a data read operation or a data write operation at the same time.

4. The phase change memory device of claim 1, wherein a plurality of precharge devices are connected to the word line and operate at the same time in response to a selection signal, and wherein a plurality of discharge devices are connected to the word line and operate at the same time in response to the selection signal.

5. The phase change memory device of claim 4, wherein the precharge devices are PMOS transistors having a first terminal connected to a supply voltage, a second terminal connected to the word line, and a gate to which the selection signal is applied, and wherein the discharge devices are NMOS transistors having a first terminal connected to the word line, a second terminal connected to a ground voltage, and a gate to which the selection signal is applied.

6. The phase change memory device of claim 5, wherein the plurality of memory cell blocks sharing the word line share a transmission line through which the selection signal is transmitted, and wherein the word line and the transmission line are located on different layers of the phase change memory device.

7. The phase change memory device of claim 1, wherein each of the memory cell blocks comprises a plurality of memory cells each including of a phase change element and a diode, and wherein a phase change material of the phase change element includes germanium (Ge), antimony (Sb), and tellurium (Te).

8. A phase change memory device comprising a plurality of word line drivers and a plurality of memory cell blocks, wherein each of the word line drivers comprises a precharge device and a discharge device, each of the memory cell blocks is disposed between one of the precharge devices and one of the discharge devices, and the precharge devices and the discharge devices of the plurality of word line drivers are alternately disposed between the memory cell blocks.

9. The phase change memory device of claim 8, wherein the plurality of memory cell blocks share the same word line.

10. The phase change memory device of claim 9, wherein the plurality of memory cell blocks sharing the word line execute a data read operation or a data write operation at the same time.

11. The phase change memory device of claim 8, wherein the precharge devices are PMOS transistors having a gate to which a selection signal is applied, and the discharge devices are NMOS transistors having a gate to which the selection signal is applied.

12. The phase change memory device of claim 11, wherein the memory cell blocks share a transmission line through which the selection signal is transmitted, and wherein the word line and the transmission line are located on different layers of the phase change memory device.

13. The phase change memory device of claim 8, wherein each of the plurality of memory cell blocks comprises:
a plurality of global bit lines; and
a plurality of local bit lines respectively connected to the plurality of global bit lines.

14. The phase change memory device of claim 8, wherein each of the memory cell blocks comprises a plurality of memory cells each including of a phase change element and a diode, and wherein a phase change material of the phase change element includes germanium (Ge), antimony (Sb), and tellurium (Te).

15. A phase change memory device comprising:
a plurality of memory cell blocks, each including a plurality of memory cells arranged in a matrix and sharing word lines connected to the plurality of memory cells; and
a plurality of word line driving blocks respectively disposed between the plurality of memory cell blocks,
wherein some of the word line driving blocks include precharge devices for precharging the word lines shared by the plurality of memory cell blocks, and others of the word line driving blocks include discharge devices for discharging the word lines shared by the plurality of memory cell blocks.

16. The phase change memory device of claim 15, wherein the word line driving blocks including the precharge devices and the word line driving blocks including the discharge devices are alternately disposed.

17. The phase change memory device of claim 15, wherein each of the precharge devices are PMOS transistors having a gate to which a selection signal is applied, and each of the discharge devices are NMOS transistors having a gate to which the selection signal is applied.

18. The phase change memory device of claim 17, wherein the plurality of memory cell blocks sharing the word lines execute a data read operation or a data write operation at the same time;

wherein the plurality of memory cell blocks share a transmission line through which the selection signal is transmitted, and wherein the word line and the transmission line are located on different layers of the phase change memory device.

19. The phase change memory device of claim 15, wherein each of the plurality of memory cell blocks comprises:
a plurality of global bit lines; and
a plurality of local bit lines respectively connected to the plurality of global bit lines.

20. The phase change memory device of claim 15, wherein the plurality of memory cell blocks sharing the word line execute a data read operation or a data write operation at the same time.

* * * * *